(12) United States Patent
Sun et al.

(10) Patent No.: US 12,177,961 B2
(45) Date of Patent: Dec. 24, 2024

(54) AIRFLOW IN A CARD-BASED COMPUTING DEVICE

(71) Applicant: NVIDIA CORPORATION, Santa Clara, CA (US)

(72) Inventors: Xiang Sun, Los Gatos, CA (US); Andrew Bell, San Francisco, CA (US); Gabriele Gorla, Santa Clara, CA (US); Boris Landwehr, Thousand Oaks, CA (US); Darryl Moore, Campbell, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 245 days.

(21) Appl. No.: 17/971,474

(22) Filed: Oct. 21, 2022

(65) Prior Publication Data

US 2023/0284371 A1    Sep. 7, 2023

Related U.S. Application Data

(60) Provisional application No. 63/315,453, filed on Mar. 1, 2022.

(51) Int. Cl.
| | |
|---|---|
| H05K 7/20 | (2006.01) |
| H05K 1/02 | (2006.01) |
| H05K 1/14 | (2006.01) |

(52) U.S. Cl.
CPC .......... *H05K 1/0203* (2013.01); *H05K 1/147* (2013.01); *H05K 7/20154* (2013.01); *H05K 7/20336* (2013.01); *H05K 7/2039* (2013.01); *H05K 2201/064* (2013.01); *H05K 2201/066* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,058,009 | A * | 5/2000 | Hood, III | G06F 1/203 361/679.55 |
| 6,778,390 | B2 * | 8/2004 | Michael | H01L 23/467 361/679.48 |
| 7,382,616 | B2 * | 6/2008 | Stefanoski | H01L 23/467 361/698 |
| 7,542,292 | B2 * | 6/2009 | Stefanoski | H05K 7/20772 361/689 |
| 8,159,819 | B2 * | 4/2012 | Memon | H01L 23/427 361/679.48 |
| 9,036,348 | B2 * | 5/2015 | Huang | G06F 1/20 417/423.15 |
| 9,213,379 | B2 * | 12/2015 | Wong | G06F 1/206 |
| 9,507,378 | B2 * | 11/2016 | Xu | G06F 1/1632 |
| 10,278,308 | B2 * | 4/2019 | Han | G06F 1/20 |
| 10,739,831 | B2 * | 8/2020 | Shabbir | G06F 1/20 |

(Continued)

*Primary Examiner* — Lisa Lea-Edmonds
(74) *Attorney, Agent, or Firm* — Artegis Law Group, LLP (57) ABSTRACT

According to various embodiments, a processing subsystem includes: a processor mounted on a first printed circuit board that is oriented parallel to a first plane; a heat sink thermally coupled to the processor; a second printed circuit board that is communicatively coupled to the first printed circuit board and oriented parallel to a second plane, wherein the second plane is not parallel with the first plane; and at least one cooling fan that is positioned to direct a cooling fluid through the heat sink in a direction parallel to the first plane.

20 Claims, 6 Drawing Sheets

(56) References Cited

U.S. PATENT DOCUMENTS

| | | | |
|---|---|---|---|
| 11,231,760 B1* | 1/2022 | Gu | G06F 1/206 |
| 11,343,902 B2* | 5/2022 | He | H05K 7/20336 |
| 11,646,240 B2* | 5/2023 | Cai | H01L 23/562 |
| | | | 257/717 |
| 11,681,340 B2* | 6/2023 | Haley | H05K 7/20154 |
| | | | 361/679.47 |
| 12,022,634 B2* | 6/2024 | Yan | F04D 19/002 |
| 2005/0061477 A1* | 3/2005 | Mira | H01L 23/467 |
| | | | 257/E23.099 |
| 2006/0039120 A1* | 2/2006 | Young | G06F 1/186 |
| | | | 361/719 |
| 2006/0164808 A1* | 7/2006 | Stefanoski | H01L 23/427 |
| | | | 257/E23.099 |
| 2011/0279969 A1* | 11/2011 | Memon | H01L 23/427 |
| | | | 361/679.47 |
| 2014/0334091 A1* | 11/2014 | Damaraju | G06F 1/206 |
| | | | 416/37 |
| 2015/0108934 A1* | 4/2015 | Wong | F04D 25/0613 |
| | | | 318/472 |
| 2019/0324506 A1* | 10/2019 | Shabbir | H05K 7/20145 |
| 2021/0294397 A1* | 9/2021 | Haley | G06F 1/20 |
| 2022/0026967 A1* | 1/2022 | Gu | G06F 1/206 |
| 2022/0246487 A1* | 8/2022 | Cai | H01L 23/49838 |
| 2023/0262925 A1* | 8/2023 | Yan | H05K 7/20172 |
| | | | 361/679.48 |
| 2023/0284371 A1* | 9/2023 | Sun | H05K 1/147 |
| | | | 361/679.47 |

* cited by examiner

AIRFLOW IN A CARD-BASED COMPUTING DEVICE

CROSS-REFERENCE TO RELATED APPLICATIONS

This application claims the priority benefit of U.S. provisional patent application titled, "AIRFLOW IN A CARD-BASED COMPUTING DEVICE" filed Mar. 1, 2022 and having Ser. No. 63/315,453. The subject matter of this related application is hereby incorporated herein by reference.

BACKGROUND

Field of the Various Embodiments

The various embodiments relate generally to computer systems and thermal solution technology and, more specifically, to improved airflow in a card-based computing device.

Description of the Related Art

In modern computing devices, central processing units (CPUs), graphics processing units (GPUs), and other integrated circuits (ICs) generate significant quantities of heat during operation. This heat needs to be removed from the computing device in order for the integrated circuits and computing device, as a whole, to operate effectively. For example, a single high-power chip, such as a CPU or GPU, can generate hundreds of watts of heat during operation, and, if this heat is not removed from the computing device, the temperature of the chip can increase to a point where the chip can be permanently damaged. To prevent thermal damage during operation, in addition to implementing conventional cooling systems, many computing devices implement clock-speed throttling when the operating temperature of a processor exceeds a certain threshold. Thus, in these computing devices, the processing speed of the high-power chip is constrained by how effectively heat is removed from the chip.

For many card-based processing subsystems, such as a graphics card with a high-power chip or GPU, efficient removal of heat generated by the chip can be hampered by the size limitations of the card-based processing subsystem. In this regard, graphics cards and other card-based processing subsystems are installed within a computing device via one of the peripheral component interconnect express (PCIe) slots located on the motherboard of the computing device. To prevent an installed graphics card from blocking most or all of the remaining PCIe slots located on the motherboard, graphics cards are typically limited in thickness to the width of one, two, three, or occasionally up to five case expansion slots of a computer chassis. That is, all the components of a graphics card, including the printed circuit board on which the GPU is mounted, the GPU heat sink, and any cooling fans, are arranged within an assembly that is limited to a thickness of 20 mm, 40 mm, 60 mm, or sometimes up to 100 mm. To fit within such a confined space, the cooling fans of a typical graphics card are oriented facing the printed circuit board, so that in operation cooling air flows directly onto the face of the printed circuit board. As a result, the path of the cooling air is deflected 90 degrees by the printed circuit board before exiting the graphics card, which creates substantial backpressure, reduced airflow, and a concomitant decrease in how effectively heat is removed from the graphics card and computing device.

As the foregoing illustrates, what is needed in the art are more effective ways to remove heat from card-based processing subsystems.

SUMMARY

According to various embodiments, a processing subsystem includes: a processor mounted on a first printed circuit board that is oriented parallel to a first plane; a heat sink thermally coupled to the processor; a second printed circuit board that is communicatively coupled to the first printed circuit board and oriented parallel to a second plane, wherein the second plane is not parallel with the first plane; and at least one cooling fan that is positioned to direct a cooling fluid through the heat sink in a direction parallel to the first plane.

At least one technical advantage of the disclosed design relative to the prior art is that the disclosed design enables cooling air to be directed across a heat sink that is used to remove heat from an integrated circuit of a card-based processing subsystem with less backpressure than that generated in conventional card-based processing subsystems. Consequently, greater airflow through the heat sink can be achieved, which enables more heat transfer from the integrated circuit and higher computing performance by the integrated circuit. These technical advantages provide one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

System Overview

Figure 1:
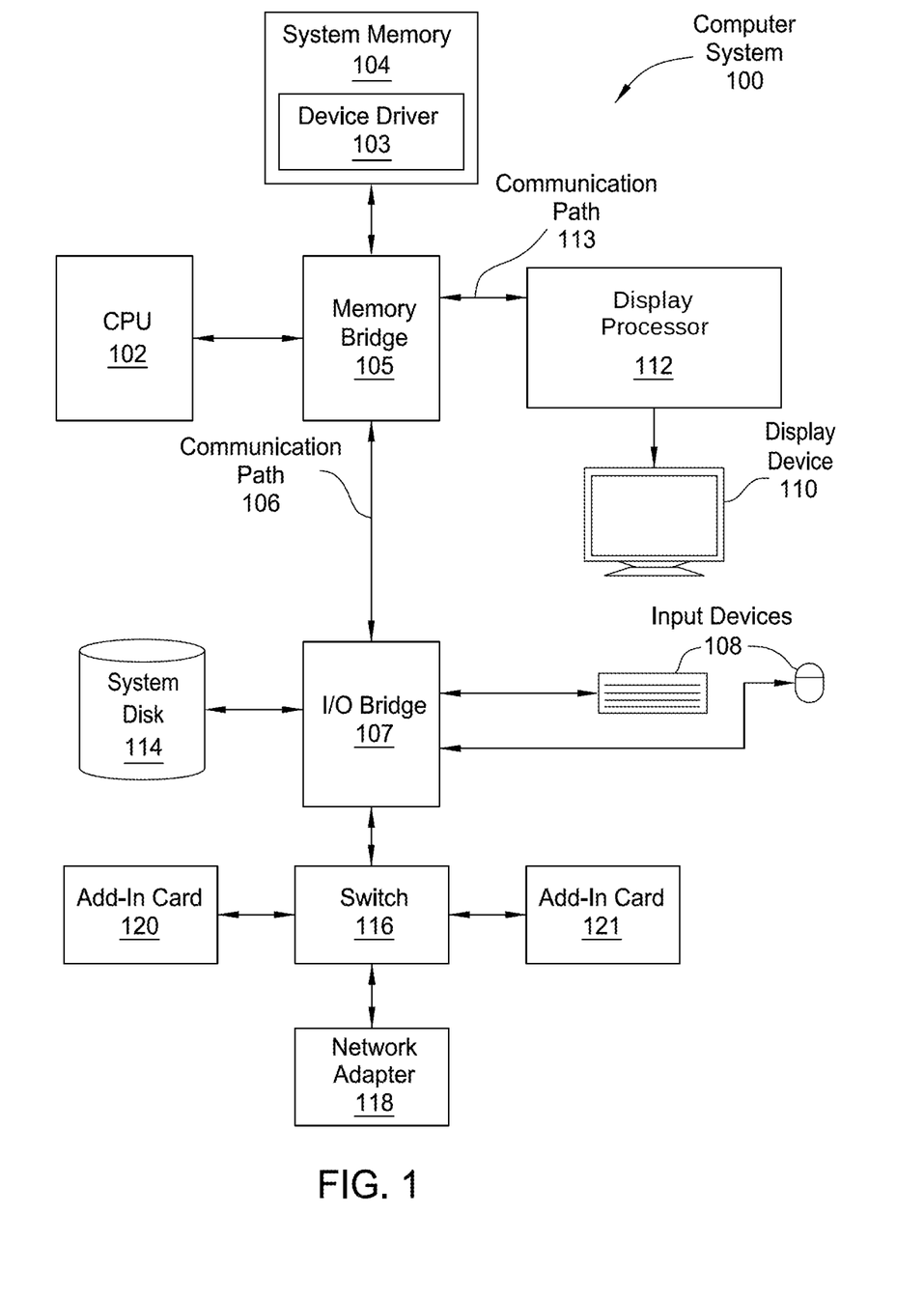
FIG. 1 is a conceptual illustration of a computer system configured to implement one or more aspects of the various embodiments.

FIG. 1 is a conceptual illustration of a computer system 100 configured to implement one or more aspects of the various embodiments. As shown, system 100 includes a central processing unit (CPU) 102 and a system memory 104 communicating via a bus path that may include a memory bridge 105. CPU 102 includes one or more processing cores, and, in operation, CPU 102 is the master processor of system 100, controlling and coordinating operations of other system components. System memory 104 stores software applications and data for use by CPU 102. CPU 102 runs software applications and optionally an operating system. Memory bridge 105, which may be, e.g., a Northbridge chip, is connected via a bus or other communication path (e.g., a HyperTransport link) to an I/O (input/output) bridge 107. I/O bridge 107, which may be, e.g., a Southbridge chip, receives user input from one or more user input devices 108 (e.g., keyboard, mouse, joystick, digitizer tablets, touch pads, touch screens, still or video cameras, motion sensors, and/or microphones) and forwards the input to CPU 102 via memory bridge 105.

A display processor 112 is coupled to memory bridge 105 via a bus or other communication path (e.g., a PCI Express, Accelerated Graphics Port, or HyperTransport link); in one embodiment display processor 112 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 104.

Display processor 112 periodically delivers pixels to a display device 110 (e.g., a screen or conventional CRT, plasma, OLED, SED or LCD based monitor or television). Additionally, display processor 112 may output pixels to film recorders adapted to reproduce computer generated images on photographic film. Display processor 112 can provide display device 110 with an analog or digital signal. In various embodiments, a graphical user interface is displayed to one or more users via display device 110, and the one or more users can input data into and receive visual output from the graphical user interface.

A system disk 114 is also connected to I/O bridge 107 and may be configured to store content and applications and data for use by CPU 102 and display processor 112. System disk 114 provides non-volatile storage for applications and data and may include fixed or removable hard disk drives, flash memory devices, and CD-ROM, DVD-ROM, Blu-ray, HD-DVD, or other magnetic, optical, or solid state storage devices.

A switch 116 provides connections between I/O bridge 107 and other components such as a network adapter 118 and various add-in cards 120 and 121. Network adapter 118 allows system 100 to communicate with other systems via an electronic communications network, and may include wired or wireless communication over local area networks and wide area networks such as the Internet.

Other components (not shown), including USB or other port connections, film recording devices, and the like, may also be connected to I/O bridge 107. For example, an audio processor may be used to generate analog or digital audio output from instructions and/or data provided by CPU 102, system memory 104, or system disk 114. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

In one embodiment, display processor 112 is configured as a processing subsystem that incorporates circuitry optimized for graphics and video processing, including, for example, video output circuitry, and constitutes a graphics processing unit (GPU). In another embodiment, display processor 112 is configured as a processing subsystem that incorporates circuitry optimized for general purpose processing. In yet another embodiment, display processor 112 may be integrated with one or more other system elements, such as the memory bridge 105, CPU 102, and I/O bridge 107 to form a system on chip (SoC). In still further embodiments, display processor 112 is omitted and software executed by CPU 102 performs the functions of display processor 112.

Pixel data can be provided to display processor 112 directly from CPU 102. In some embodiments, instructions and/or data representing a scene are provided to a render farm or a set of server computers, each similar to system 100, via network adapter 118 or system disk 114. The render farm generates one or more rendered images of the scene using the provided instructions and/or data. These rendered images may be stored on computer-readable media in a digital format and optionally returned to system 100 for display. Similarly, stereo image pairs processed by display processor 112 may be output to other systems for display, stored in system disk 114, or stored on computer-readable media in a digital format.

Alternatively, CPU 102 provides display processor 112 with data and/or instructions defining the desired output images, from which display processor 112 generates the pixel data of one or more output images, including characterizing and/or adjusting the offset between stereo image pairs. The data and/or instructions defining the desired output images can be stored in system memory 104 or graphics memory within display processor 112. In an embodiment, display processor 112 includes 3D rendering capabilities for generating pixel data for output images from instructions and data defining the geometry, lighting shading, texturing, motion, and/or camera parameters for a scene. Display processor 112 can further include one or more programmable execution units capable of executing shader programs, tone mapping programs, and the like.

Further, in other embodiments, CPU 102 or display processor 112 may be replaced with or supplemented by any technically feasible form of processing device configured process data and execute program code. Such a processing device could be, for example, a central processing unit (CPU), a graphics processing unit (GPU), an application-specific integrated circuit (ASIC), a field-programmable gate array (FPGA), and so forth. In various embodiments any of the operations and/or functions described herein can be performed by CPU 102, display processor 112, or one or more other processing devices or any combination of these different processors.

CPU 102, render farm, and/or display processor 112 can employ any surface or volume rendering technique known in the art to create one or more rendered images from the provided data and instructions, including rasterization, scan-line rendering REYES or micropolygon rendering, ray casting, ray tracing, image-based rendering techniques, and/or combinations of these and any other rendering or image processing techniques known in the art.

In other contemplated embodiments, system 100 may or may not include other elements shown in FIG. 1. System memory 104 and/or other memory units or devices in system 100 may include instructions that, when executed, cause the robot or robotic device represented by system 100 to perform one or more operations, steps, tasks, or the like.

It will be appreciated that the system shown herein is illustrative and that variations and modifications are possible. The connection topology, including the number and arrangement of bridges, may be modified as desired. For instance, in some embodiments, system memory 104 is connected to CPU 102 directly rather than through a bridge, and other devices communicate with system memory 104 via memory bridge 105 and CPU 102. In other alternative topologies display processor 112 is connected to I/O bridge 107 or directly to CPU 102, rather than to memory bridge 105. In still other embodiments, I/O bridge 107 and memory bridge 105 might be integrated into a single chip. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

Figure 2:
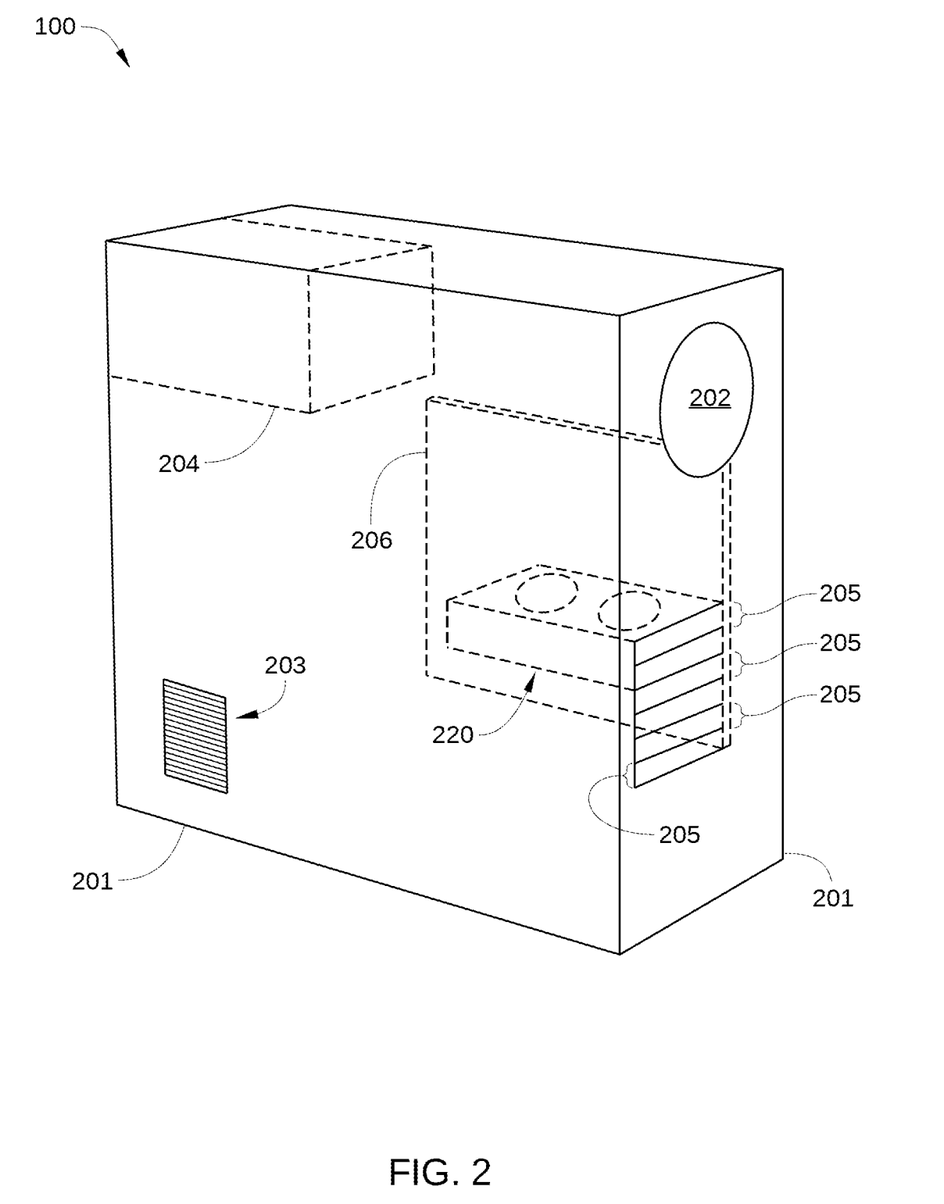
FIG. 2 is a more detailed illustration of the computer system of FIG. 1, according to an embodiment.

FIG. 2 is a more detailed illustration of computer system 100, according to an embodiment. As shown, computer system 100 includes a chassis 201 (also referred to as a "case" or "housing") with one or more system cooling fans 202 mounted thereon and one or more cooling inlets 203 formed therein. Cooling fans 202 are configured to draw cooling air into chassis 201, for example via cooling inlets 203, to remove heat generated by various electronic components of computer system 100. Computer system 100 further includes a power supply 204 mounted within chassis 201, a plurality of chassis expansion slots 205 that are typically located on a rear surface of chassis 201, and a motherboard 206 disposed within chassis 201.

Computer system 100 further includes various external connections (omitted for clarity) mounted on a rear and/or front surface of chassis 201, such as a power connection, Universal Serial Bus (USB) connections, an audio input jack, an audio output jack, one or more video output connections, and/or other connections. In some embodiments, one or more of such external connections are associated with motherboard 206 or an expansion card that is coupled to motherboard 206 and installed in a chassis expansion slot 205, such as a card-based processing subsystem 220.

In the embodiment illustrated in FIG. 2, motherboard 206 is configured with a central processing unit (CPU) and one or more card edge connectors, such as peripheral component interconnect express (PCIe) slots, that are each positioned to correspond to a different chassis expansion slot 205. For clarity, the CPU and card edge connectors of motherboard 206 are omitted in FIG. 2. Generally, computer system 100 is configured with one or more expansion cards or other card-based processing subsystems that are each mounted in a different chassis expansion slot 205 and communicatively coupled to motherboard 206 via a corresponding card edge connector. Examples of such card-based processing subsystems include card-based processing subsystems 220, such as wireless adapters, sound cards, graphics cards, network adapter 118, add-in cards 120, 121, or display processor 112 of FIG. 1, and/or the like. In the embodiment illustrated in FIG. 2, a single card-based processing subsystem 220 is coupled to motherboard 206, but in other embodiments, a plurality of card-based processing subsystems 220 may be coupled to motherboard 206.

In some embodiments, computer system 100 further includes one or more peripheral devices (not shown) that are communicatively coupled to motherboard 206 and/or a particular expansion card coupled to motherboard 206. For example, in some embodiments, computer system 100 includes one or more of a keyboard, mouse, joystick, digitizer tablet, touch pad, touch screen, display device, external hard drive, still or video cameras, motion sensors, microphones, and/or the like.

In the embodiment illustrated in FIG. 2, computer system 100 is depicted as a tower-configured desktop computer system. In other embodiments, computer system 100 can have any configuration that can include a card-based processing subsystem, such as a tower server computer system, a blade server computer system, a rack server computer system, a laptop computer, and the like.

Card-Based Processing Subsystem

Figure 3A:
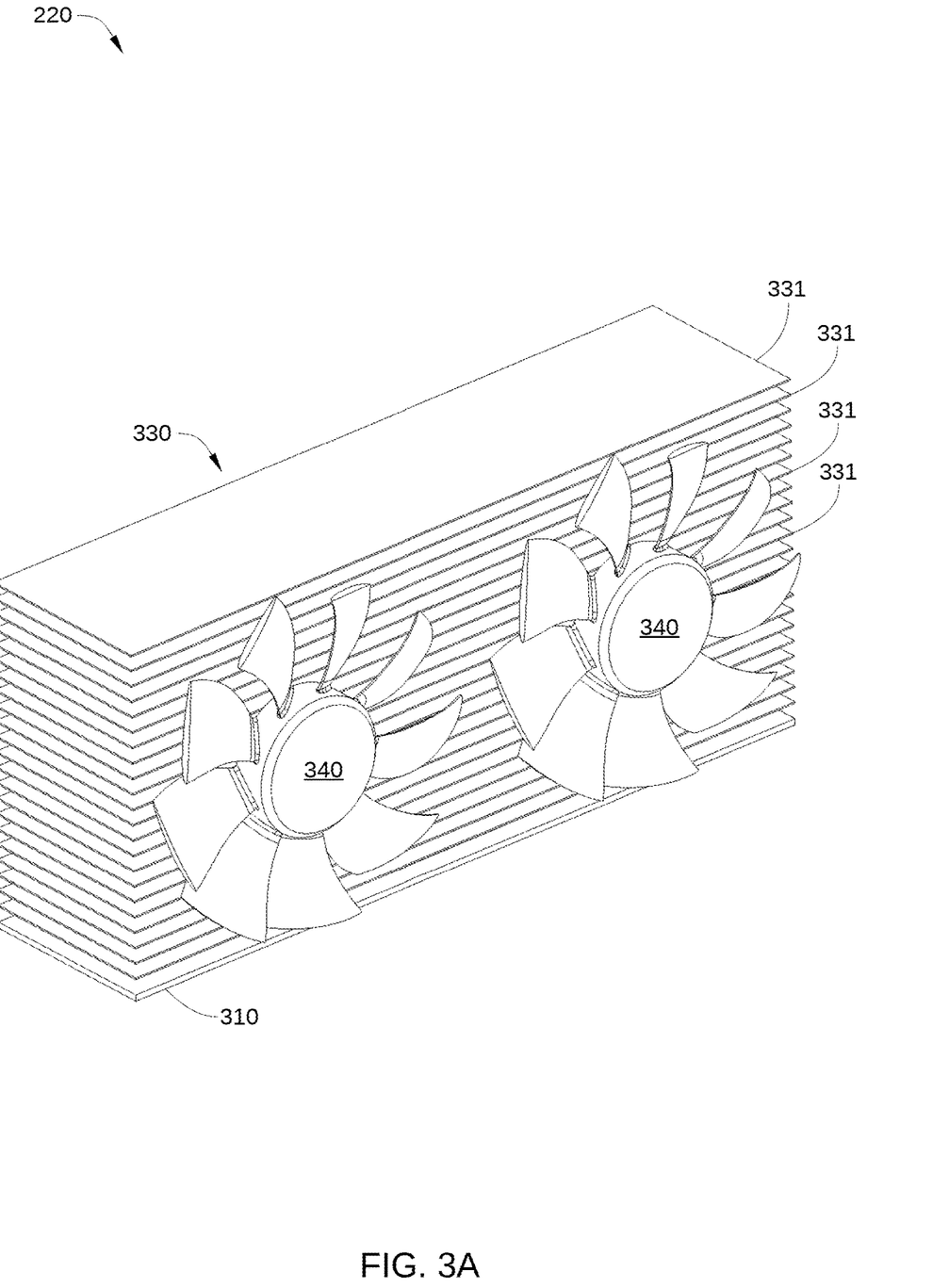
FIGS. 3A-3C are more detailed illustrations of the card-based processing subsystem of FIG. 2, according to various embodiments.
Figure 3B:
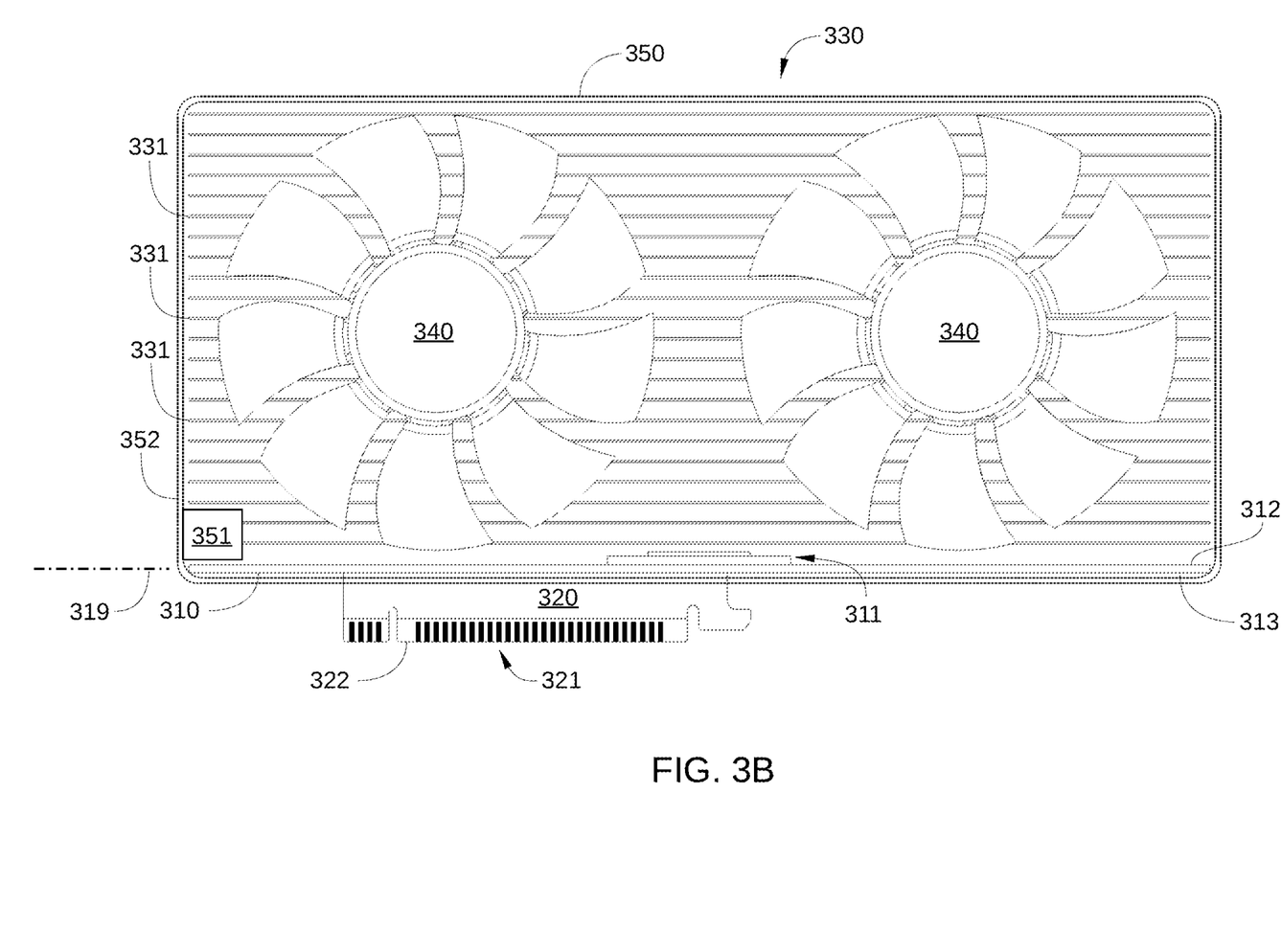
Figure 3C:
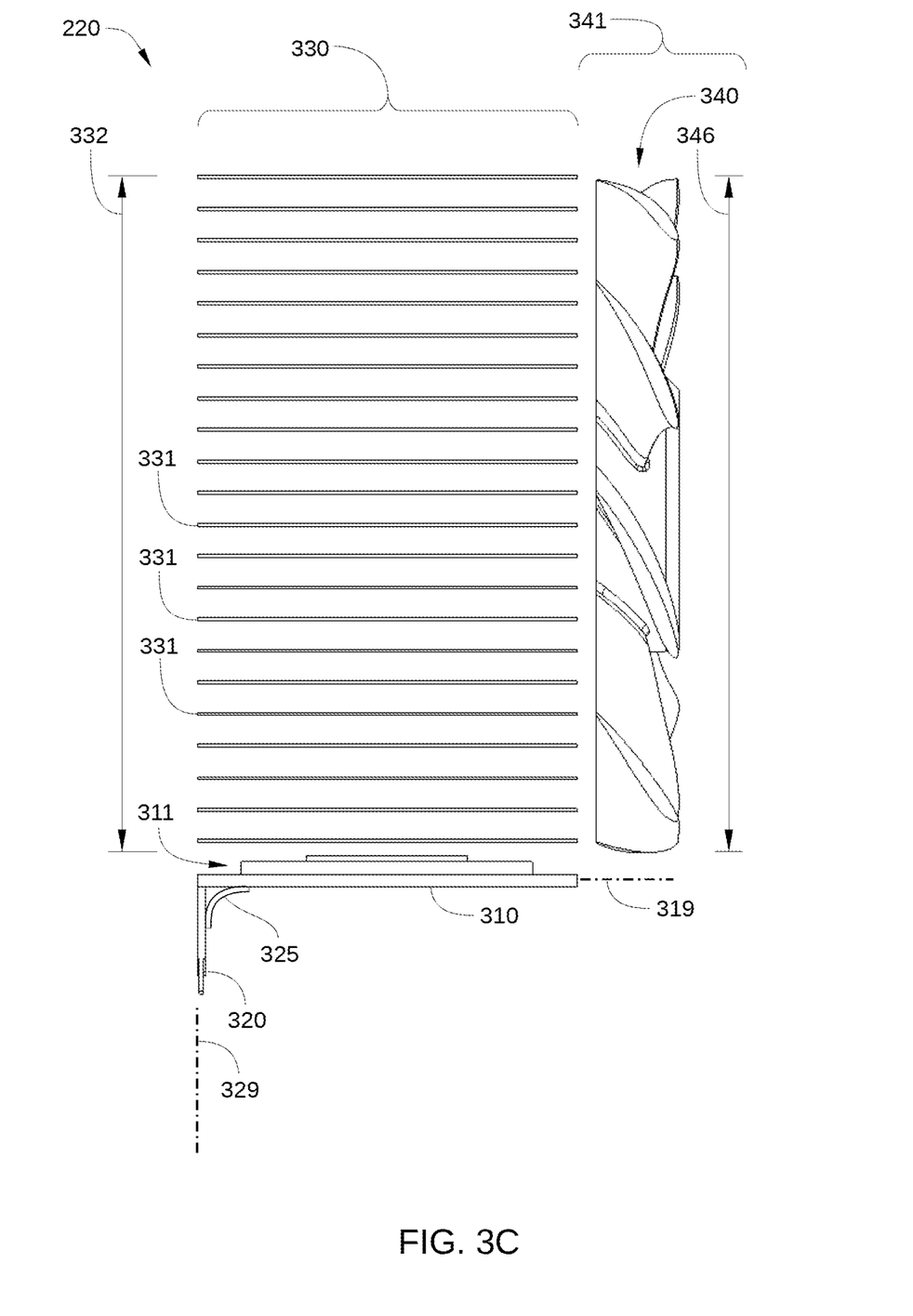

FIGS. 3A-3C are more detailed illustrations of card-based processing subsystem 220, according to various embodiments. Specifically, FIG. 3A is a perspective view of card-based computing 220, according to various embodiments, FIG. 3B is a side view of card-based processing subsystem 220, according to various embodiments, and FIG. 3C is an end view of card-based processing subsystem 220, according to various embodiments. As shown, card-based processing subsystem 220 includes a first printed circuit board (PCB) 310 communicatively coupled to a second PCB 320, a heat exchanger 330 that includes a plurality of cooling fins 331, and one or more cooling fans 340 that are oriented to force cooling air (or any other suitable cooling fluid) through cooling fins 331.

In some embodiments, card-based processing subsystem 220 further includes a frame 350 (depicted with dashed lines in FIG. 3B), within which first PCB 310, second PCB 320, heat exchanger 330, and cooling fans 340 are disposed. In such embodiments, frame 350 can facilitate positioning of cooling fans 340 relative to first PCB 310, second PCB 320, and heat exchanger 330. Further, in such embodiments, one or more connection ports 351 (shown in FIG. 3B) may be disposed on a wall 352 of the frame 350, such as a USB connection, an audio input jack, an audio output jack, one or more video output connections, and/or other connections. For example, in embodiments in which card-based processing subsystem 220 is configured as a graphics card, the one or more connection ports 351 include a video connection, such as a video graphics array (VGA) connection, a digital video interface (DVI) connection, a high-definition multimedia interface (HDMI) connection, and/or a DisplayPort. Generally, wall 352 is a surface of card-based processing subsystem 220 that corresponds to a chassis expansion slot 205 of when card-based processing subsystem 220 is installed on motherboard 206 of computer system 100 (chassis expansion slots 205 and motherboard 206 are shown in FIG. 2).

First PCB 310 has one or more integrated circuits (ICs) 311 mounted thereon. For example, in embodiments in which card-based processing subsystem 220 is configured as a graphics card, the one or more ICs 311 include a graphics processing unit (GPU) and associated graphics memory chips. In some embodiments, first PCB 310 has one or more ICs 311 mounted on top surface 312 (that faces heat sink 330), and in other embodiments first PCB 310 has one or more ICs 311 mounted on top surface 312 and on a bottom surface 313 (that faces away from heat sink 330). In embodiments in which card-based processing subsystem 220 is configured as a graphics card, the GPU is generally mounted on top surface 312 and is thermally coupled to heat sink 330, for example via thermal paste (not shown) and the like.

Heat sink 330 is configured to transfer heat generated by ICs 311 and first PCB 310 away from first PCB 310. Cooling air directed into heat sink 330 by cooling fans 340 then transports the heat out of card-based processing subsystem 220. In some embodiments, heat sink 330 includes cooling fins 331 that are thermally coupled to one or more ICs 311 mounted on first PCB 310. Further, in some embodiments, heat sink 330 includes a vapor chamber and heat pipes (not shown) that employ evaporative cooling to transfer heat from the one or more ICs 311 mounted on first PCB 310 to cooling fins 331. As shown, cooling fins 331 of heat sink 330 are oriented substantially parallel to the flow of air (or other cooling fluid) received from cooling fans 340. Thus, in the embodiment illustrated in FIGS. 3A-3C, cooling fins 331 are oriented parallel to first PCB 310 and perpendicular to second PCB 320.

Second PCB 320 is configured to communicatively couple card-based processing subsystem 220 to a card edge connector, such as a PCIe slot included on motherboard 206 of computer system 100. To that end, second PCB 320 includes a plurality of edge connectors 321 formed on an edge 322 of second PCB 320. As shown, edge 322 is disposed on an opposite side of second PCB 320 from first PCB 310, thereby enabling card-based processing subsystem 220 to be installed on motherboard 206 without interference by first PCB 310.

As shown in FIG. 3C, first PCB 310 is oriented in a first plane 319 and second PCB 320 is oriented in a second plane 329 that is not parallel with first plane 319. In the embodiment illustrated in FIGS. 3A-3C, first plane 319 is orthogonal to second plane 329. As a result, cooling fans 340 can be positioned adjacent to cooling fins 331 of heat sink 330 and direct air (or another cooling fluid) through heat sink 330 in a direction substantially parallel to cooling fins 331. Further, the air or cooling fluid directed through cooling fins 331 can then pass unobstructed out of heat sink 331 and card-based processing subsystem 220. As a result, there is no backpressure generated by a PCB or other component of card-based processing subsystem 220 that redirects the air or other cooling fluid prior to exiting card-based processing subsystem 220. In conventional card-based processing subsystems, cooling fans are oftentimes oriented to direct cooling air perpendicular to the PCB that couples the card-based processing subsystem to a PCIe slot. However, in conventional card-based processing subsystems, the PCB that couples the card-based processing subsystem to a PCIe slot generally extends across some or all of the path of the cooling air, causing the cooling air to be redirected 90 degrees before exiting the card-based processing subsystem. By contrast, airflow generated by cooling fans 340 passes directly through cooling fins 331 and exits card-based processing subsystem 220 without substantially changing direction.

First PCB 310 and second PCB 320 are communicatively coupled, so that ICs 311 are accessible to motherboard 206 and other components of computer system 100. In some embodiments, first PCB 310 and second PCB 320 are communicatively coupled via a flexible PCB 325 (shown in FIG. 3C). Alternatively, in some embodiments, first PCB 310 and second PCB 320 are formed together as a single rigid-flex PCB assembly. In such embodiments, first PCB 310 and second PCB 320 may be positioned proximate each other in card-based processing subsystem 220, but not in physical contact, except via the flexible portion of the rigid-flex PCB assembly. In such embodiments, the flexible portion of the rigid-flex PCB assembly can have a similar configuration to flexible PCB 325. In yet other embodiments, first PCB 310 and second PCB 320 are physically and communicatively coupled together via a rigid connection technique, such as via pin connectors and sockets.

Cooling fans 340 are disposed proximate heat sink 330 and oriented to force air (or any other cooling fluid) through cooling fins 331 of heat sink 330. Thus, in the embodiment illustrated in FIGS. 3A-3C, cooling fans are oriented to cause airflow in a direction parallel to first PCB 310 and cooling fins 331 and perpendicular to PCB 320. In some embodiments, cooling fans 340 are positioned in a side region 341 of card-based processing subsystem 220, as shown in FIG. 3C. As a result, a diameter 346 of cooling fans 340 can be equal to or greater than a height 332 of heat exchanger 330. Thus, in some embodiments, diameter 346 of cooling fans 340 can extend past first plane 319, and therefore be greater than height 332 of heat exchanger 330.

Improved Airflow in Card-Based Processing Subsystem

Figure 4:
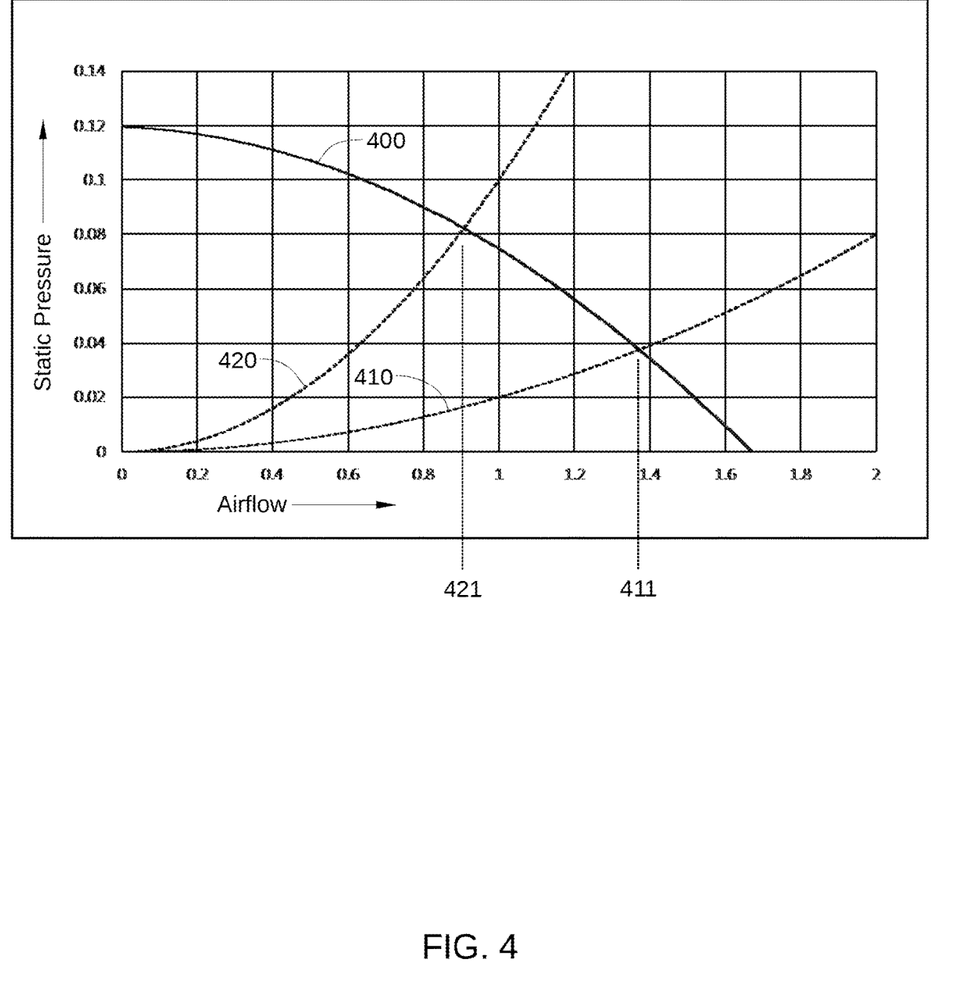
FIG. 4 is a schematic illustration of exemplar improvements in cooling airflow that can be achieved when implementing the various embodiments.

FIG. 4 is a schematic illustration of exemplar improvements in cooling airflow that can be achieved when implementing the various embodiments. Specifically, FIG. 4 includes a fan curve 400 (solid line), a low-impedance system curve 410, and a high-impedance system curve 420. Fan curve 400 illustrates, for a particular fan speed, the relationship between the static pressure capabilities (y-axis) of the cooling fans 340 compared to air flow rate (x-axis). Low-impedance system curve 410 illustrates the static pressure required to achieve a specific airflow for a low-impedance air-handling system, such as the air-handling system represented by cooling fans 340 and heat sink 330 of card-based processing subsystem 220. High-impedance system curve 420 illustrates the static pressure required to achieve a specific airflow for a high-impedance air-handling system, such as an air-handling system represented by a card-based processing subsystem that includes cooling fans 340, a heat sink similar to heat sink 330, and a PCB that extends across some or all of the path of cooling air generated by cooling fans 340 and causes the cooling air to be redirected 90 degrees before exiting the card-based processing subsystem.

When cooling fans 340 operate at the particular fan speed associated with fan curve 400 and are fluidly coupled to the low-impedance air-handling system, a first airflow 411 is generated. First airflow 411 is indicated by the intersection of fan curve 400 and low-impedance system curve 410. By contrast, when cooling fans 340 operate at the particular fan speed associated with fan curve 400 and are fluidly coupled to the high-impedance air-handling system, a second airflow 421 is generated. Second airflow 421 is indicated by the intersection of fan curve 400 and high-impedance system curve 420. As shown, first airflow 411 is significantly higher than second airflow 421, indicating that the decreased backpressure of the low-impedance air-handling system (e.g., card-based processing subsystem 220) enables substantially more airflow through heat sink 330. As noted previously, greater airflow results in greater heat removal from ICs included in card-based processing subsystem 220. In the case of processor ICs, greater heat removal capacity enables higher operating power, and therefore higher computational performance of the processor ICs.

In sum, the various embodiments shown and provided herein set forth techniques for improved cooling in card-based processing subsystems. Specifically, a card-based processing subsystem, such as a graphics card, includes a first PCB that is oriented parallel to a first plane and a second PCB that is oriented parallel to a second plane. In some embodiments, most or all of the ICs of the card-based processing subsystem are mounted on the first PCB and the second PCB is configured for communicatively coupling the card-based processing subsystem to a motherboard. One or more cooling fans of the card-based processing subsystem are oriented to direct a cooling fluid directly through a heat sink in a direction parallel to the first plane.

At least one technical advantage of the disclosed design relative to the prior art is that the disclosed design enables cooling air to be directed across a heat sink that is used to remove heat from an integrated circuit of a card-based processing subsystem with less backpressure than that generated in conventional card-based processing subsystems. Consequently, greater airflow through the heat sink can be achieved, which enables more heat transfer from the integrated circuit and higher computing performance by the integrated circuit. These technical advantages provide one or more technological advancements over prior art approaches.

1. In some embodiments, a processing subsystem comprises: a processor mounted on a first printed circuit board that is oriented parallel to a first plane; a heat sink thermally coupled to the processor; a second printed circuit board that is communicatively coupled to the first printed circuit board and oriented parallel to a second plane, wherein the second plane is not parallel with the first plane; and at least one cooling fan that is positioned to direct a cooling fluid through the heat sink in a direction parallel to the first plane.
2. The processing subsystem of clause 1, wherein the first plane is orthogonal to the second plane.
3. The processing subsystem of clauses 1 or 2, wherein the first printed circuit board is coupled to the second printed circuit board via a flexible printed circuit board.
4. The processing subsystem of any of clauses 1-3, wherein the first printed circuit board and the second printed circuit board are configured as a rigid-flex printed circuit board assembly.
5. The processing subsystem of any of clauses 1-4, further comprising a frame, within which the PCB, the cooling fan, and the heat sink are disposed.
6. The processing subsystem of any of clauses 1-5, further comprising at least one connection port that is disposed on a wall of the frame.
7. The processing subsystem of any of clauses 1-6, wherein the heat sink includes a plurality of cooling fins that are oriented parallel to the first plane.
8. The processing subsystem of any of clauses 1-7, wherein the second printed circuit board couples the processing subsystem to a card edge connector.
9. The processing subsystem of any of clauses 1-8, wherein the second printed circuit board includes a plurality of edge connectors formed on an edge of the second printed circuit board opposite the first printed circuit board.
10. The processing subsystem of any of clauses 1-9, wherein the heat sink includes a vapor chamber and at least one heat pipe.
11. The processing subsystem of any of clauses 1-10, wherein a diameter of the at least one cooling fan that is greater than thickness of the processing subsystem.
12. The processing subsystem of any of clauses 1-11, wherein a thickness of the processing subsystem is equal to or less than at least one of a single chassis expansion slot, two chassis expansion slots, or three chassis expansion slots.
13. In some embodiments, a computer system comprises: a chassis; a power supply disposed within the chassis; a motherboard disposed within the chassis and electrically coupled to the power supply; and a processing subsystem within the chassis that is communicatively coupled to the motherboard and includes: a processor mounted on a first printed circuit board that is oriented parallel to a first plane; a heat sink thermally coupled to the processor; a second printed circuit board that is communicatively coupled to the first printed circuit board and oriented parallel to a second plane, wherein the second plane is not parallel with the first plane; and at least one cooling fan that is positioned to direct a cooling fluid through the heat sink in a direction parallel to the first plane.
14. The computer system of clause 13, wherein the first plane is orthogonal to the second plane.
15. The computer system of clauses 13 or 14, wherein the first printed circuit board is coupled to the second printed circuit board via a flexible printed circuit board.
16. The computer system of any of clauses 13-15, wherein the first printed circuit board and the second printed circuit board are configured as a rigid-flex printed circuit board assembly.
17. The computer system of any of clauses 13-16, further comprising a frame, within which the PCB, the cooling fan, and the heat sink are disposed.
18. The computer system of any of clauses 13-17, further comprising at least one connection port that is disposed on a wall of the frame.
19. The computer system of any of clauses 13-18, wherein the heat sink includes a plurality of cooling fins that are oriented parallel to the first plane.
20. The computer system of any of clauses 13-19, wherein the second printed circuit board couples the processing subsystem to a card edge connector.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

While the preceding is directed to embodiments of the present disclosure, other and further embodiments of the disclosure may be devised without departing from the basic scope thereof, and the scope thereof is determined by the claims that follow.

What is claimed is:

1. A processing subsystem, comprising:
    a processor mounted on a first printed circuit board that is oriented parallel to a first plane;
    a heat sink thermally coupled to the processor;
    a second printed circuit board that is communicatively coupled to the first printed circuit board and oriented parallel to a second plane, wherein the second plane is not parallel with the first plane; and
    at least one cooling fan that is positioned to direct a cooling fluid through the heat sink in a direction parallel to the first plane.
2. The processing subsystem of claim 1, wherein the first plane is orthogonal to the second plane.
3. The processing subsystem of claim 1, wherein the first printed circuit board is coupled to the second printed circuit board via a flexible printed circuit board.

4. The processing subsystem of claim 1, wherein the first printed circuit board and the second printed circuit board are configured as a rigid-flex printed circuit board assembly.

5. The processing subsystem of claim 1, further comprising a frame, within which the PCB, the cooling fan, and the heat sink are disposed.

6. The processing subsystem of claim 5, further comprising at least one connection port that is disposed on a wall of the frame.

7. The processing subsystem of claim 1, wherein the heat sink includes a plurality of cooling fins that are oriented parallel to the first plane.

8. The processing subsystem of claim 1, wherein the second printed circuit board couples the processing subsystem to a card edge connector.

9. The processing subsystem of claim 8, wherein the second printed circuit board includes a plurality of edge connectors formed on an edge of the second printed circuit board opposite the first printed circuit board.

10. The processing subsystem of claim 1, wherein the heat sink includes a vapor chamber and at least one heat pipe.

11. The processing subsystem of claim 1, wherein a diameter of the at least one cooling fan that is greater than thickness of the processing subsystem.

12. The processing subsystem of claim 1, wherein a thickness of the processing subsystem is equal to or less than at least one of a single chassis expansion slot, two chassis expansion slots, or three chassis expansion slots.

13. A computer system, comprising:
 a chassis;
 a power supply disposed within the chassis;
 a motherboard disposed within the chassis and electrically coupled to the power supply; and
 a processing subsystem within the chassis that is communicatively coupled to the motherboard and includes:
  a processor mounted on a first printed circuit board that is oriented parallel to a first plane;
  a heat sink thermally coupled to the processor;
  a second printed circuit board that is communicatively coupled to the first printed circuit board and oriented parallel to a second plane, wherein the second plane is not parallel with the first plane; and
  at least one cooling fan that is positioned to direct a cooling fluid through the heat sink in a direction parallel to the first plane.

14. The computer system of claim 13, wherein the first plane is orthogonal to the second plane.

15. The computer system of claim 13, wherein the first printed circuit board is coupled to the second printed circuit board via a flexible printed circuit board.

16. The computer system of claim 13, wherein the first printed circuit board and the second printed circuit board are configured as a rigid-flex printed circuit board assembly.

17. The computer system of claim 13, further comprising a frame, within which the PCB, the cooling fan, and the heat sink are disposed.

18. The computer system of claim 17, further comprising at least one connection port that is disposed on a wall of the frame.

19. The computer system of claim 13, wherein the heat sink includes a plurality of cooling fins that are oriented parallel to the first plane.

20. The computer system of claim 13, wherein the second printed circuit board couples the processing subsystem to a card edge connector.

* * * * *